(12) United States Patent
Kim et al.

(10) Patent No.: US 8,368,054 B2
(45) Date of Patent: Feb. 5, 2013

(54) ORGANIC LIGHT EMITTING DIODE DISPLAY

(75) Inventors: Hyo-Seok Kim, Namyangju-si (KR); Kyong-Tae Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1150 days.

(21) Appl. No.: 12/250,092

(22) Filed: Oct. 13, 2008

(65) Prior Publication Data

US 2009/0146929 A1 Jun. 11, 2009

(30) Foreign Application Priority Data

Dec. 10, 2007 (KR) .................. 10-2007-0127678

(51) Int. Cl.
*H01L 29/08* (2006.01)
*H01L 35/24* (2006.01)
*H01L 51/00* (2006.01)

(52) U.S. Cl. .......... 257/40; 257/483; 257/E21.158; 257/E51.022; 438/28; 438/35; 439/51; 439/577; 313/483; 313/504; 313/505; 313/506; 313/509; 345/76; 345/82; 345/85; 345/204; 345/600

(58) Field of Classification Search .......... 257/40, 257/483, E21.158, E51.022; 438/28, 35; 439/51, 577; 313/169.3, 483, 504–506, 509; 345/76, 82–85, 204, 600
See application file for complete search history.

(56) References Cited

U.S. PATENT DOCUMENTS

| | | | | |
|---|---|---|---|---|
| 2002/0014837 A1* | 2/2002 | Kim et al. | ...................... | 313/505 |
| 2005/0173700 A1* | 8/2005 | Liao et al. | ...................... | 257/40 |
| 2005/0242712 A1 | 11/2005 | Sung | | |
| 2007/0120868 A1* | 5/2007 | Baek | .............................. | 345/600 |

FOREIGN PATENT DOCUMENTS

| | | |
|---|---|---|
| JP | 11-204264 | 7/1999 |
| JP | 2006-228712 | 8/2006 |
| JP | 2006-278258 | 10/2006 |
| JP | 2006-302506 | 11/2006 |
| KR | 10-2006-0112980 | 11/2006 |
| KR | 10-0741135 | 7/2007 |

OTHER PUBLICATIONS

Patent Abstracts of Japan, English Language Abstract for JP Publication No. 2006-228712, Aug. 31, 2006, 2 pages.
Patent Abstracts of Japan, English Language Abstract for JP Publication No. 2006-302506, Nov. 1, 2006, 2 pages.
Patent Abstracts of Japan, English Language Abstract for JP Publication No. 2006-278258, Oct. 12, 2006, 2 pages.
Patent Abstracts of Japan, English Language Abstract for JP Publication No. 11-204264, Jul. 30, 1999, 2 pages. Korean Patent Abstracts, English Language Abstract for KR Publication No. 10-0741135, Jul. 12, 2007, 1 page.
Korean Patent Abstracts, English Language Abstract for KR Publication No. 1020060112980, Nov. 2, 2006, 1 page.
Korean Patent Abstracts, English Language Abstract for KR Publication No. 1020050050488, May 31, 2005, 1 page.
Korean Patent Abstracts, English Language Abstract for KR Publication No. 1020040065381, Jul. 22, 2004, 1 page.
Korean Patent Abstracts, English Language Abstract for KR Publication No. 1020050014437, Feb. 7, 2005, 1 page.

* cited by examiner

*Primary Examiner* — Meiya Li
(74) *Attorney, Agent, or Firm* — Innovation Counsel LLP (57) ABSTRACT

In an organic light emitting diode display including a first pixel and a second pixel that are associated with respective different colors, each of the first and second pixels being for displaying its associated color, each of the first and second pixels includes: a first electrode; a second electrode facing the first electrode; and a light emitting member formed between the first electrode and the second electrode; wherein the light emitting member of the first pixel includes: at least two light-emitting elements for emitting light of the color associated with the first pixel; and a charge generation layer between the at least two light-emitting elements; and wherein the second pixel has fewer light-emitting elements than the first pixel.

29 Claims, 9 Drawing Sheets

FIG.1

| G | B | R | G | B |
|---|---|---|---|---|
| B | R | G | B | R |
| R | G | B | R | G |
| G | B | R | G | B |
| B | R | G | B | R |

ORGANIC LIGHT EMITTING DIODE DISPLAY

CROSS-REFERENCE TO RELATED APPLICATION

This application claims priority to and the benefit of South Korean Patent Application No. 10-2007-0127678 filed in the Korean Intellectual Property Office on Dec. 10, 2007, the entire contents of which are incorporated herein by reference.

BACKGROUND AND SUMMARY

The present invention relates to an organic light emitting diode display.

The wide use of personal computers and televisions sets has been accompanied by a demand for lightweight and thin display devices. This demand has been met by flat panel displays such as liquid crystal displays (LCD), which often displaced the heavier and bulkier cathode ray tube displays (CRTs).

However, the LCD is a passive display device, so it may need an additional light source such as backlight. Also, the LCD has various problems such as a slow response time and a narrow viewing angle.

An organic light emitting diode (OLED) display is another type of a flat panel display which has recently showed much promise in addressing these problems. The OLED display includes an organic light emitting layer interposed between two electrodes. One of the two electrodes injects holes and the other electrode injects electrons into the light emitting layer. The injected electrons and holes recombine to form excitons and emit the released energy in the form of light.

Because the OLED display is self-emissive, an additional light source is not necessary, resulting in low power consumption. The OLED also has a high response speed, wide viewing angle, and high contrast ratio.

However, the lifetime of the OLED display is not optimal if the OLED combines different light emitting materials with different lifetimes for display of different colors, e.g. red, green and blue. In particular, the blue light emitting material may have a significantly shorter lifetime than the red and green light emitting materials.

To make the lifetimes more uniform, the pixels using materials with shorter lifetimes are made larger than the other pixels. This however may preclude patterning of the different light emitting organic materials with a single shadow mask. Also, the small size of the pixels with longer-lifetime materials reduces these pixels' lifetime and hence reduces the total lifetime of the OLED device.

The above information is only for explaining the background of the invention and is not necessarily prior art and is not necessarily known in this country to a person of ordinary skill in the art.

Some embodiments of the present invention provide OLED devices with longer lifetimes even when using conventional light emitting materials.

Some embodiments include an organic light emitting diode (OLED) display comprising a first pixel and a second pixel that are associated with respective different colors, each of the first and second pixels being for displaying its associated color, wherein each of the first and second pixels comprises: a first electrode; a second electrode facing the first electrode; and a light emitting member formed between the first electrode and the second electrode; wherein the light emitting member of the first pixel comprises: at least two light-emitting elements for emitting light of the color associated with the first pixel; and a charge generation layer between the at least two light-emitting elements; and wherein the light emitting-member of the second pixel has fewer light-emitting elements than the light-emitting member of the first pixel.

Some embodiments further comprise a third pixel associated with a color different from the first and second pixels' associated colors, the third pixel being for displaying its associated color; wherein the third pixel comprises: a first electrode; a second electrode facing the first electrode; and a light emitting member formed between the first electrode and the second electrode; wherein the light emitting-member of the third pixel has fewer light-emitting elements than the light-emitting member of the first pixel.

In some embodiments, the first electrodes of the first, second and third pixels are parts of a common electrode.

In some embodiments, each light-emitting element of the first pixel has a shorter lifetime than each light-emitting element of the second and third pixels.

In some embodiments, the light-emitting elements of the first pixel, the second pixel, and the third pixel are for respectively emitting blue, red, and green light.

In some embodiments, the at least two light emitting elements of the first pixel comprise a first light-emitting element between the first pixel's first electrode and the charge generation layer and also comprise and a second light-emitting element between the charge generation layer and the first pixel's second electrode; the light emitting member of the first pixel further comprises an auxiliary layer formed between the first pixel's first electrode and the first light-emitting element or between the first light-emitting element and the charge generation layer or between the charge generation layer and the second light-emitting element or between the second light-emitting element and the first pixel's second electrode; the light emitting member of the second pixel further comprises an auxiliary layer formed between the second pixel's first electrode and the second pixel's one or more light-emitting elements or between the second pixel's one or more light-emitting elements and the second pixel's second electrode; and the light emitting member of the third pixel comprises an auxiliary layer formed between the third pixel's first electrode and the third pixel's one or more light-emitting elements or between the third pixel's one or more light-emitting elements and the third pixel's second electrode.

In some embodiments, the light emitting member of the first pixel is thicker than the light emitting members of the second and third pixels.

In some embodiments, the light emitting members of the second pixel and the third pixel have substantially the same thickness.

In some embodiments, the first, second, and third pixels have substantially equal areas.

In some embodiments, the first, second, and third pixels each include a driving transistor connected to the respective pixel's first electrode, and the OLED display further comprises circuitry for providing a first driving voltage to the driving transistor of the first pixel and for providing a second driving voltage different from the first driving voltage to the driving transistors of the second and third pixels.

In some embodiments, the circuitry comprises: a first driving voltage line connected to the driving transistor of the first pixel for transmitting the first driving voltage; and a second driving voltage line connected to the driving transistors of the second and third pixels for transmitting the second driving voltage.

In some embodiments, the first, second, and third pixels each include a driving transistor connected to the respective pixel's first electrode, and the OLED display further comprises circuitry for generating data signals in response to luminance levels and supplying the data signals to the driving transistors, wherein for any luminance level, the corresponding data signal for the driving transistor of the first pixel has a larger voltage than the corresponding data signal for the driving transistor of each of the second and third pixels.

Some embodiments include an OLED display comprising: a first pixel and a second pixel, wherein each of the first and second pixels comprises: a driving transistor; and one or more light-emitting elements connected to the driving transistor; wherein the first pixel comprises at least two light-emitting elements for emitting a color associated with the first pixel, and also comprises a charge generation layer disposed between the at least two light-emitting elements; and each light-emitting element of the first pixel has a shorter lifetime than each light-emitting element of the second pixel.

Some embodiments further comprise a third pixel comprising a driving transistor and one or more light-emitting elements connected to the driving transistor; wherein each light-emitting element of the first pixel has a shorter lifetime than each light-emitting element of the third pixel.

In some embodiments, the light-emitting elements of the first pixel, the second pixel, and the third pixel are for respectively emitting blue, red, and green light.

In some embodiments, wherein the first, second, and third pixels have substantially equal areas.

In some embodiments, a combined thickness of the one or more light emitting elements in the first pixel is greater than in the second pixel and greater than in the third pixel.

Some embodiments further comprise circuitry for providing a first driving voltage to the driving transistor of the first pixel and for providing a second driving voltage different from the first driving voltage to the driving transistors of the second and third pixels.

In some embodiments, the circuitry comprises: a first driving voltage line connected to the driving transistor of the first pixel for transmitting the first driving voltage; and a second driving voltage line connected to the driving transistors of the second and third pixels for transmitting the second driving voltage.

Some embodiments further comprise circuitry for generating data signals in response to luminance levels and supplying the data signals to the driving transistors, wherein for any luminance level, the corresponding data signal for the driving transistor of the first pixel has a larger voltage than the corresponding data signal for the driving transistor of each of the second and third pixels.

Some embodiments include an OLED display comprising: (1) a first pixel comprising: a driving transistor; and at least two light-emitting diodes connected to the driving transistor; (2) a second pixel comprising: a driving transistor; and only one light-emitting diode, said only one light-emitting diode being connected to the second pixel's driving transistor; wherein each light-emitting diode of the first pixel has a shorter lifetime than the light-emitting diode of the second pixel, and (3) circuitry for supplying a first driving voltage to the driving transistor of the first pixel and for supplying a second driving voltage different from the first driving voltage to the driving transistor of the second pixel.

Some embodiments further comprise: a third pixel comprising: a driving transistor; and only one light-emitting diode; wherein the the third pixel's light-emitting diode is connected to the third pixel's driving transistor; wherein each light-emitting diode of the first pixel has a shorter lifetime than the light-emitting diode of the third pixel, and said circuitry is for supplying the second driving voltage to the driving transistor of the third pixel.

In some embodiments, said circuitry comprises: a first driving voltage line connected to the driving transistor of the first pixel for transmitting the first driving voltage, and a second driving voltage line connected to the driving transistors of the second and the third pixel for transmitting the second driving voltage.

In some embodiments, the first pixel comprises: first and second light-emitting elements for emitting light of the same color; a first electrode disposed under the first light-emitting element; a second electrode disposed over the second light-emitting element; and a charge generation layer disposed between the first and second light-emitting elements, wherein the first electrode, the first light-emitting element, and the charge generation layer form one of the two light emitting diodes of the first pixel, and the charge generation layer, the second light-emitting element, and the second electrode form the other one of the two light emitting diodes of the first pixel.

Some embodiments include an OLED display comprising: a first pixel and a second pixel, wherein each of the first and second pixels comprises: a driving transistor; and one or more light-emitting elements connected to the driving transistor; wherein at least on light-emitting element of the first pixel has a shorter lifetime than at least one light-emitting element of the second pixel, and wherein the OLED display further comprises circuitry for generating data signals in response to luminance levels and supplying the data signals to the driving transistors, wherein for a given luminance level, the corresponding data signal for the driving transistor of the first pixel has a larger voltage than the corresponding data signal for the driving transistor of the second pixel.

Some embodiments further comprise a third pixel which comprises a driving transistor and one or more light-emitting elements connected to the driving transistor, wherein the circuitry is for generating and supplying the data signals to the driving transistor of the third pixel, wherein for a given luminance level, the corresponding data signal for the driving transistor of the first pixel has a larger voltage than the corresponding data signal for the driving transistor of the third pixel.

In some embodiments, the one or more light-emitting elements of the first pixel comprise first and second light-emitting elements for emitting light of the same color; wherein the first pixel further comprises: a first electrode disposed under the first light-emitting element; a second electrode disposed on the second light-emitting element; and a charge generation layer disposed between the first and second light-emitting elements, wherein the first electrode, the first light-emitting element, and the charge generation layer form a first light emitting diode, and the charge generation layer, the second light-emitting element, and the second electrode form a second light emitting diode.

Some embodiments include a method for operating an OLED display, the method comprising providing the first driving voltage to the driving transistor of the first pixel and providing the second driving voltage to the driving transistors of the second and third pixels.

Some embodiments include a method for operating the OLED display, the method comprising providing different data signals to the first pixel and at least one of the second and third pixels for a given luminance level.

In some embodiments, the lifetime of the display device may be increased, and the areas of all pixels may be optimally designed to reduce the cost and time required to manufacture the display.

The invention is not limited to embodiments having the advantages described above. Other features are described below. The invention is defined by the appended claims.

DESCRIPTION OF SOME REFERENCE NUMERALS USED IN THE DRAWINGS

| | |
|---|---|
| 110: substrate | 81, 82: contact liners |
| 85: interconnect | 121: gate line |
| 124a: first control electrode | 124b: second control electrode |
| 127: storage electrode | 129: contact pad at an end of a gate line |
| 140: gate insulating layer | 154a, 154b: semiconductor regions |
| 171: data line | 172R, 172G, 172B: driving voltage line |
| 173a: first input electrode | 173b: second input electrode |
| 175a: first output electrode | 175b: second output electrode |
| 179: contact pad at an end of a data line | 191: pixel electrode |
| 181, 182, 184, 185a, 185b: contact hole | |
| 270: common electrode | 361: insulating layer |
| 370R, 370G, 370B, 371, 372: organic light emitting member | |
| 373: charge generation layer | 375: hole transport layer |
| 376R, 376G, 376B: organic emission layer | |
| 377: electron transport layer | 378: electron injection layer |
| R: red pixel | G: green pixel |
| B: blue pixel | Cst: storage capacitor |
| Qs: switching transistor | Qd: driving transistor |
| LD: organic light emitting diode | Vss: common voltage |

DETAILED DESCRIPTION OF SOME EMBODIMENTS

The embodiments described in this section illustrate but do not limit the invention. The invention is defined by the appended claims.

In the drawings, various sizes may be exaggerated for clarity. Like reference numerals designate like elements. It will be understood that when an element such as a layer, film, region, or substrate is referred to as being "on" another element, it can be directly on the other element or intervening elements may also be present. In contrast, when an element is referred to as being "directly on" another element, there are no intervening elements present.

[Exemplary Embodiment 1]

Figure 1:
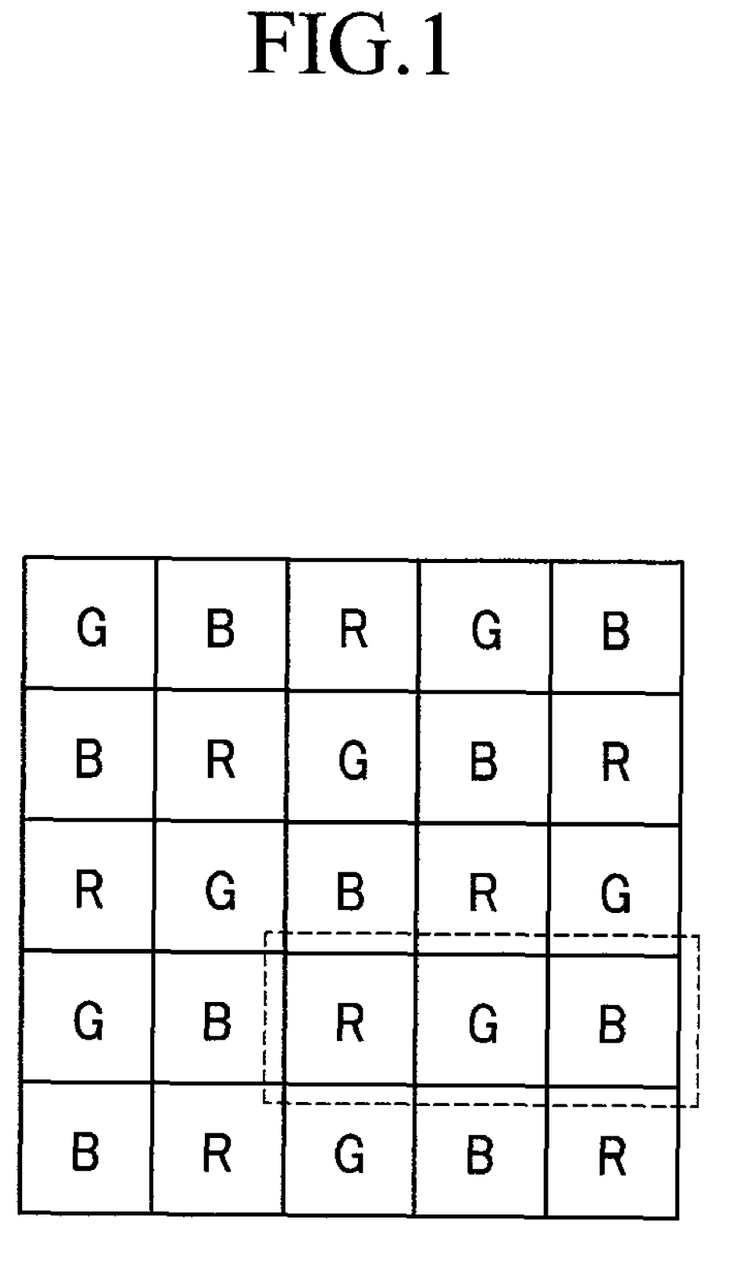
FIG. 1 is a schematic diagram showing an arrangement of a plurality of pixels in the OLED display according to an exemplary embodiment of the present invention.
Figure 2:
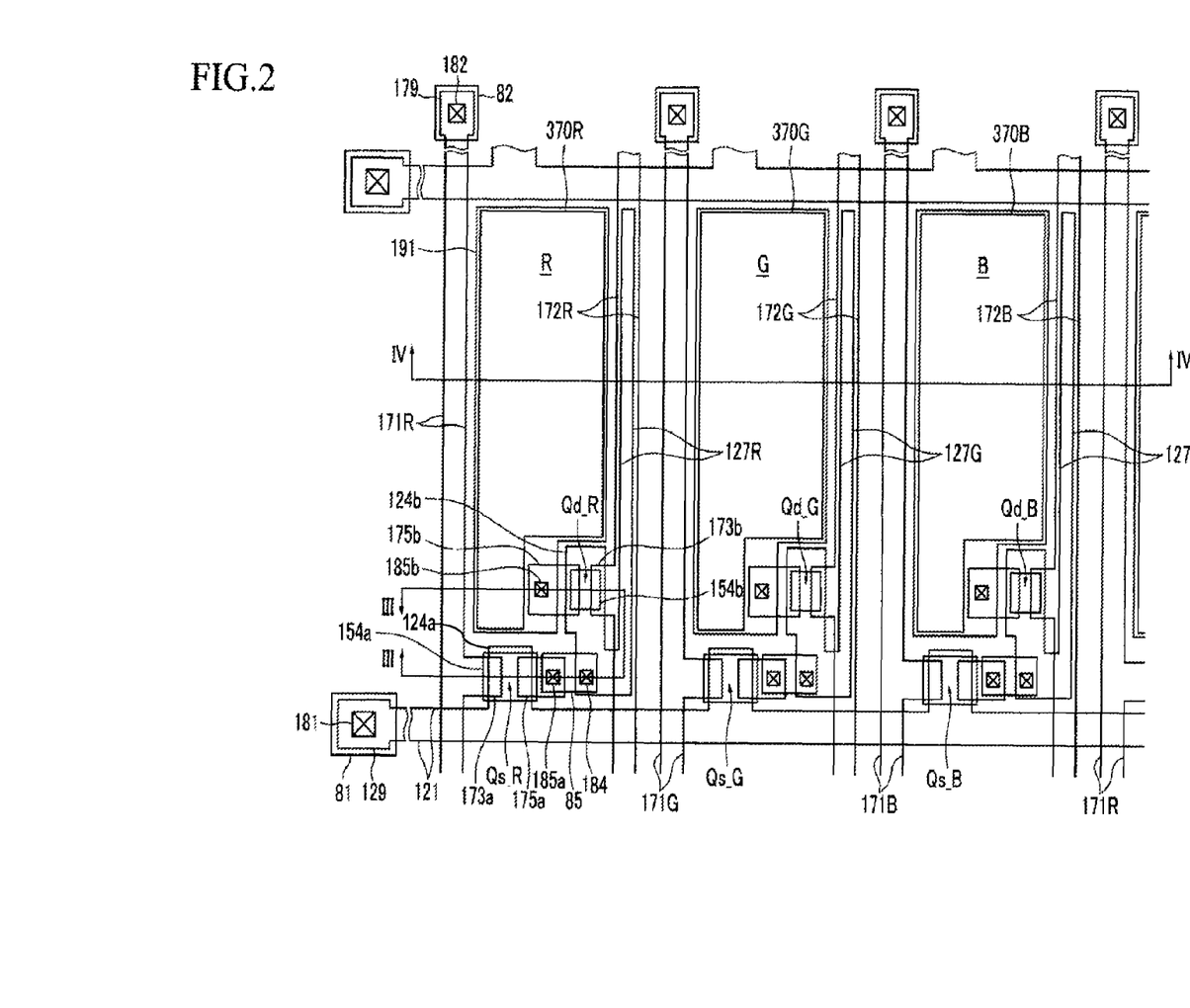
FIG. 2 is a layout view showing three neighboring pixels in the OLED display shown in FIG. 1.
Figure 3:
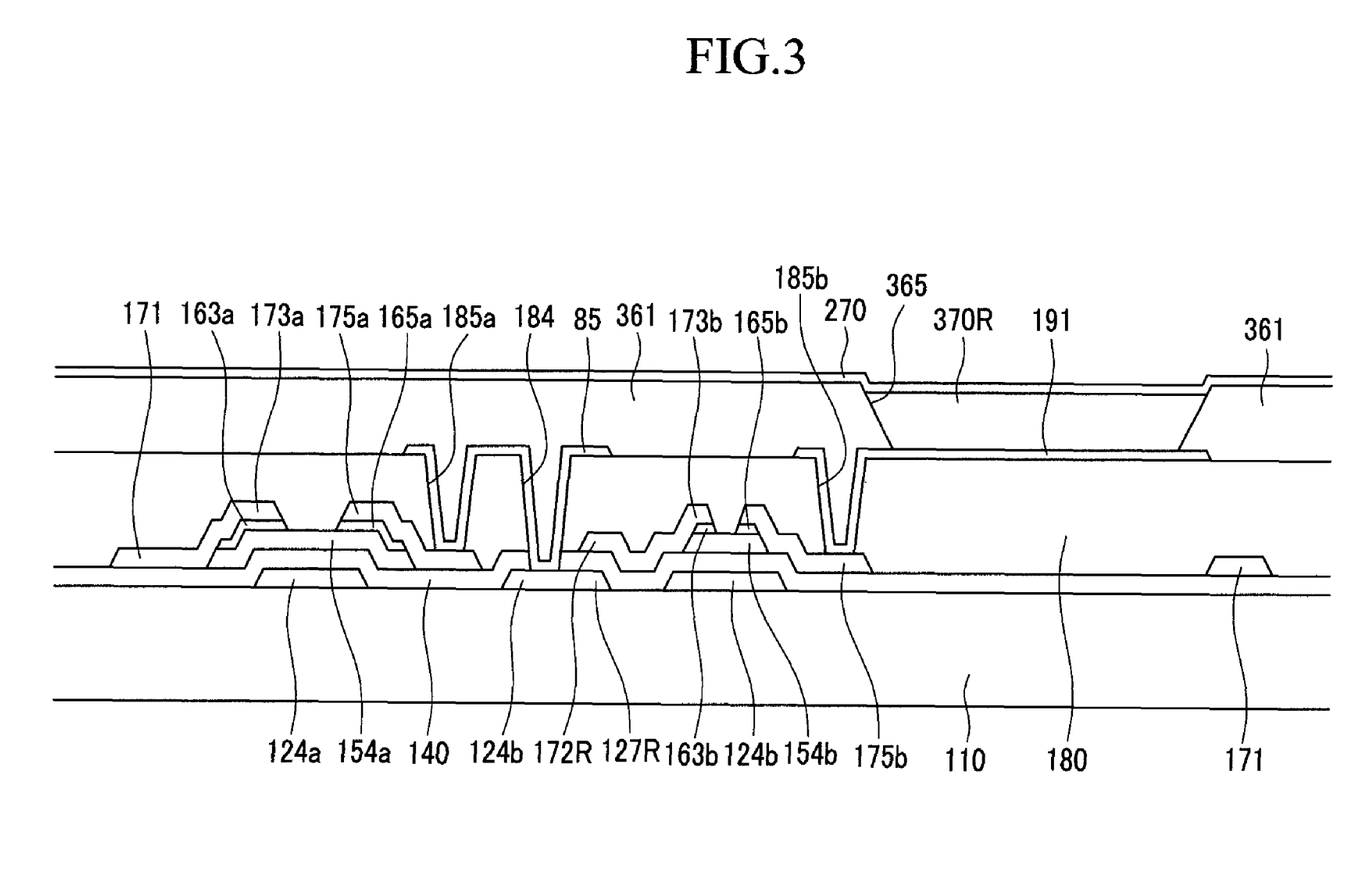
FIG. 3 and FIG. 4 are cross-sectional views of the OLED display of FIG. 2 taken along the lines III-III and IV-IV.
Figure 4:
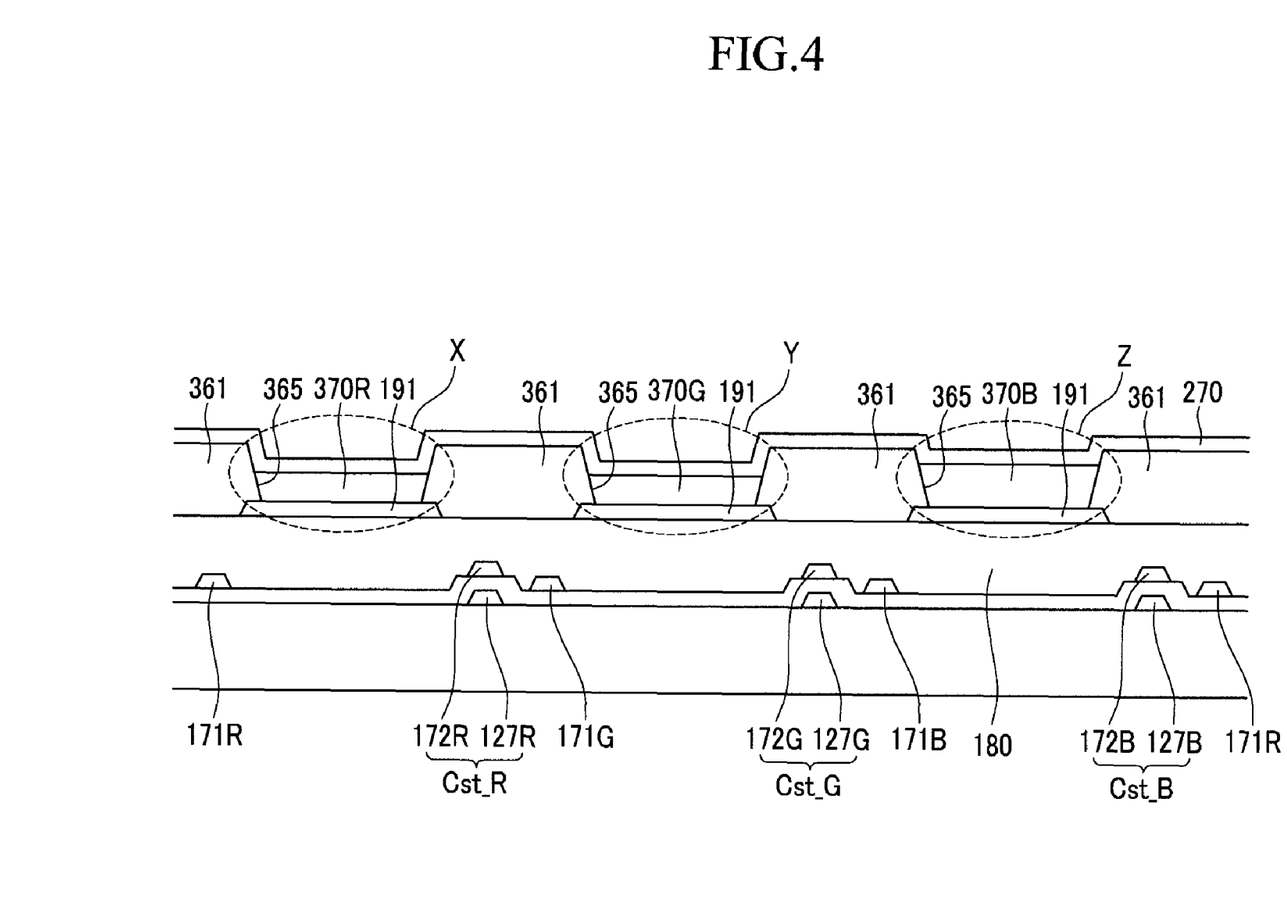

An OLED display according to an exemplary embodiment of the present invention will now be described in detail with the reference to FIGS. 1 to 4. FIG. 1 is a schematic diagram showing an arrangement of pixels in the OLED display, FIG. 2 is a layout view showing three neighboring pixels in the OLED display of FIG. 1, and FIG. 3 and FIG. 4 show vertical cross-sections marked respectively as III-III and IV-IV in FIG. 2.

Referring to FIG. 1, red pixels R, green pixels G, and blue pixels B alternate in the OLED display for displaying respectively red, green, and blue colors. The red, green and blue colors are primary colors used to construct other colors for the display, and pixels of other colors may be used in addition or instead the red, green and blue pixels.

The pixels are arranged as tripples of a red pixel R, a green pixel G, and a blue pixel B, and these tripples may repeat in each row and column. However, other arrangements and pixel shapes may be used.

Now the structure of the OLED display will be described with reference to FIGS. 2 to 4. Each red pixel R of the OLED display is connected to a gate line 121, a data line 171R, and a driving voltage line 172R; each green pixel G is connected to a gate line 121, a data line 171G, and a driving voltage line 172G; and each blue pixel B is connected to a gate line 121, a data line 171B, and a driving voltage line 172B.

In each pixel R, G, and B, similar elements are designated by the same reference numerals.

Referring to FIGS. 2 to 4, gate conductors are formed on an insulating substrate 110 to provide gate lines 121 and second control electrodes 124b. The gate lines 121 transmit gate signals and extend substantially in the horizontal direction in the view of FIG. 2. Each gate line 121 includes first control electrodes 124a projecting upward in the view of FIG. 2. Each gate line 121 ends in a widened contact pad 129 used for contacting another layer or an external driving circuit. The second control electrodes 124b are spaced from the gate lines 121 and include storage electrodes 127R, 127G, and 127B substantially parallel to each other.

A gate insulating layer 140 is formed over the gate conductors 121 and 124b, and first semiconductor regions 154a and second semiconductor regions 154b preferably made of amorphous silicon or polysilicon overlie the gate insulating layer 140. The first semiconductor regions 154a overlap the first control electrodes 124a and the second semiconductor regions 154b overlap the second control electrodes 124b.

Pairs of first ohmic contacts 163a, 165a and pairs of second ohmic contacts 163b, 165b are formed on the first and second semiconductor regions 154a and 154b. One pair of a first ohmic contact 163a and a first ohmic contact 165a is disposed on each first semiconductor region 154a, and one pair of a second ohmic contact 163b and a second ohmic contact 165b is disposed on each second semiconductor region 154b.

Data conductors including data lines 171R, 171G, and 171B, driving voltage lines 172R, 172G, and 172B, and first and second output electrodes 175a and 175b are formed over the ohmic contacts 163a, 163b, 165a, and 165b and the gate insulating layer 140.

The data lines 171R, 171G, and 171B transmit data signals and extend in a vertical direction in the view of FIG. 2 to cross over the gate lines 121. Each of the data lines 171R, 171G, and 171B includes a plurality of first input electrodes 173a extending toward the first control electrodes 124a, and ends in a widened contact pad 179 used for contact with another layer or an external driving circuit.

The driving voltage lines 172R, 172G, and 172B transmit driving voltages and extend in a vertical direction to cross over the gate lines 121. In some other embodiments, the driving voltage lines 172R, 172G, and 172B extend in the horizontal direction and cross over or under the data lines 171R, 171G, and 171B. Each driving voltage line 172R, 172G, and 172B includes a plurality of second input electrodes 173b extending toward the second control electrodes 124b and overlaps with the storage electrodes 127R, 127G, and 127B.

The first and second output electrodes 175a and 175b are spaced from each other, and are spaced from the data lines 171R, 171G, and 171B and the driving voltage lines 172R, 172G, and 172B. The first input electrodes 173a and the first output electrodes 175a are opposite to each other on the first semiconductor regions 154a, and the second input electrodes 173b and the second output electrodes 175b are opposite to each other on the second semiconductor regions 154b.

A passivation layer 180 is formed over the data conductors 171R, 171G, 171B, 172R, 172G, 172B, 175a, 175b and the exposed semiconductor regions 154a and 154b. The passivation layer 180 has contact holes 182 exposing the contact pads 179 of the data lines 171R, 171G, and 171B; contact holes 185a exposing the first output electrodes 175a; and contact holes 185b exposing the second output electrodes 175b. Also, contact holes 181 and 184 are formed through the passivation layer 180 and the gate insulating layer 140 to expose respectively the contact pads 129 of the gate lines 121 and the second input electrodes 124b.

Pixel electrodes 191, interconnects 85, and contact liners 81 and 82 are formed on the passivation layer 180.

The pixel electrodes 191 are connected to the second output electrodes 175b through the contact holes 185b. The interconnects 85 connect the second control electrodes 124b to the first output electrodes 175a through the contact holes 184 and 185a. The contact liners 81 and 82 contact the contact pads 129 and 179 through the contact holes 181 and 182, respectively.

An insulating layer 361 is formed on the passivation layer 180. The insulating layer 361 has a plurality of openings 365 exposing the respective pixel electrodes 191.

Organic light emitting members 370R, 370G, and 370B are formed from a plurality of layers in the openings 365. The organic light emitting members 370R, 370G, and 370B may include auxiliary layers (not shown) for improving light emitting efficiency as well as light emission layers for emitting red, green, and blue light at respective pixels R, G, and B. In this embodiment, each organic light emitting member 370B for a blue pixel B includes at least two light-emitting elements each of which is formed by a light emission layer. The organic light emitting members 370G and 370B for the red and green pixels R and G each include fewer light-emitting elements than the organic light emitting member 370B. For example, in one embodiment, each organic light emitting member 370B of the blue pixel B includes two emission layers, and the organic light emitting members 370G and 370B of the red and green pixels R and G each include a single emission layer. Also, the organic light emitting members 370B of the blue pixels B are thicker than the organic light emitting members 370G and 370R of the red and green pixels R and G. Further details of some embodiments of the organic light emitting members 370R, 370G, 370B are provided below.

A common electrode 270 is formed over the organic light emitting members 370R, 370G, and 370B.

The pixel electrodes 191, the light emission layers of the light emitting members 370R, 370G, 370B, and the common electrode 270 form organic light emitting diodes LD in which the pixel electrodes 191 serve as anodes and the common electrode 270 serves as a common cathode, or the pixel electrodes 191 serve as cathodes and the common electrode 270 as a common anode.

The storage electrodes 127R, 127G, and 127B and the driving voltage lines 172R, 172G, and 172B overlap to form storage capacitors Cst_R, Cst_G, and Cst_B.

The organic light emitting members 370R, 370G, and 370B will now be described with reference to FIGS. 5A to 5C.

Figure 5A:
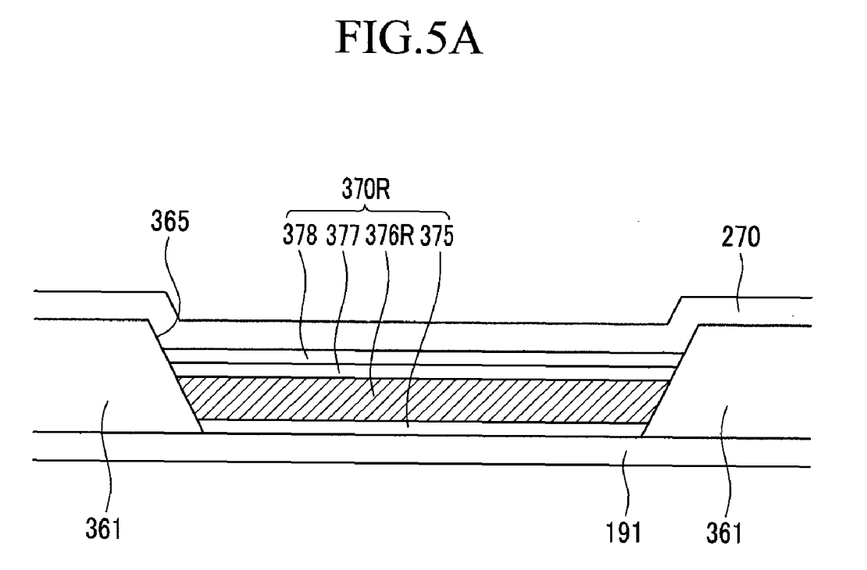
FIG. 5A to FIG. 5C are cross-sectional views showing respectively the organic light emitting members of red, green, and blue pixels, and are enlarged views of areas shown respectively as "X", "Y", and "Z" in FIG. 4.
Figure 5B:
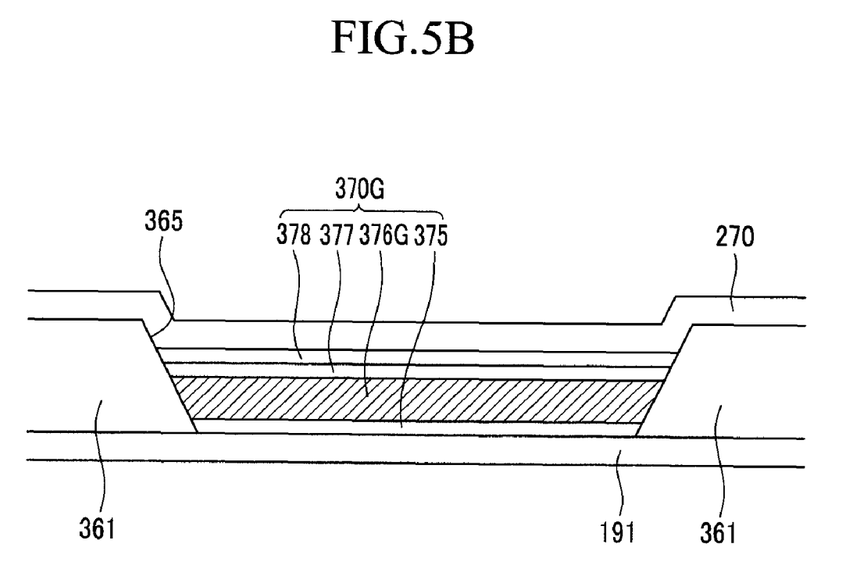
Figure 5C:
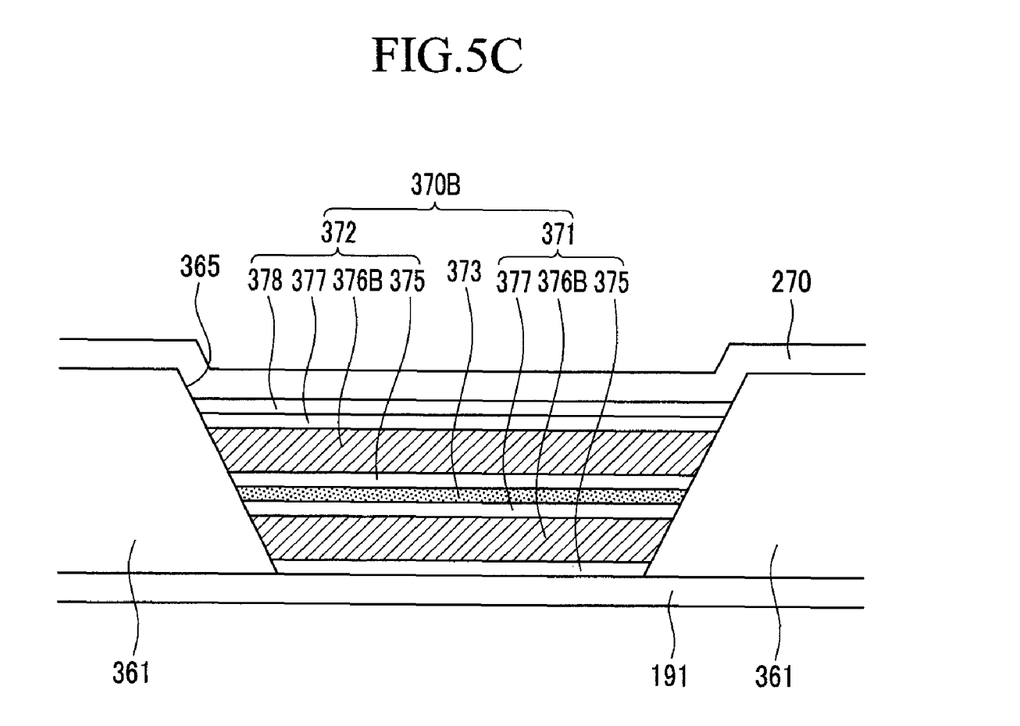

FIGS. 5A to 5C are cross-sectional views showing respectively the organic light emitting members of a red pixel, a green pixel, and a blue pixel, and are enlarged views of the respective portions "X", "Y", and "Z" of FIG. 4.

The organic light emitting members of the red pixel R and the green pixel G will now be described with reference to FIGS. 5A and 5B.

The organic light emitting member 370R of the red pixel R includes a red light-emitting element provided by emission layer 376R emitting red light, a hole transport layer 375 disposed between the pixel electrode 191 and the red emission layer 376R, and an electron transport layer 377 and an electron injection layer 378 that are disposed between the red emission layer 376R and the common electrode 270.

The organic light emitting member 370G of the green pixel G includes a green light-emitting element provided by emission layer 376G emitting green light, a hole transport layer 375 disposed between the pixel electrode 191 and the green emission layer 376G, and an electron transport layer 377 and an electron injection layer 378 that are disposed between the green emission layer 376G and the common electrode 270.

In this embodiment, the hole transport layer 375, the electron transport layer 377, and the electron injection layer 378 are auxiliary layers for improving the emitting efficiency of the emission layer. The hole transport layer 375 efficiently transports holes from the pixel electrode 191 to the emission layers 370R and 370G, and the electron transport layer 377 and the electron injection layer 378 efficiently inject and transport electrons from the common electrode 270 to the emission layers 370R and 370G. Additional auxiliary layers (not shown) may be included such as a hole injection layer, and some or all of the auxiliary layers may be omitted.

In the embodiment of FIGS. 2-4, the hole transport layer 375 of the red and green pixels R and G, the electron transport layer 377 of the red and green pixels R and G, and the electron injection layer 378 of the red and green pixels R and G are patterned using the same shadow mask, and therefore the red and green pixels R and G may have substantially the same thickness. Thus, the organic light emitting member 370R of the red pixel R and the organic light emitting member 370G of the green pixel G have substantially the same thickness.

The organic light emitting member of the blue pixel B will now be described in detail with reference to FIG. 5C. The blue pixel B includes a charge generation layer 373 between two organic light emitting members 371 and 372.

The first organic light emitting member 371 includes a blue light-emitting element provided by blue emission layer 376B, a hole transport layer 375 between the pixel electrode 191 and the blue emission layer 376B, and an electron transport layer 377 between the blue emission layer 376B and the charge generation layer 373.

The second organic light emitting member 372 includes a blue light-emitting element provided by blue emission layer 376B, a hole transport layer 375 between the charge generation layer 373 and the blue emission layer 376B, and an electron transport layer 377 and an electron injection layer 378 that are disposed between the blue emission layer 376B and the common electrode 270.

The charge generation layer 373 supplies electrons and holes to the first and second organic light emitting members 371 and 372, and may include a plurality of layers of different materials or a single layer of uniform composition. In the case of the plurality of layers, the charge generation layer 373 may include one layer to supply electrons to the first organic light emitting member 371 and another layer to supply holes to the second organic light emitting member 372. For example, the charge generation layer 373 may be formed of an n-type layer for efficiently injecting electrons and a p-type layer for efficiently injecting holes. The two layers may be formed sequentially one after the other. The n-type layer may be a metal-doped organic material such as Cs-doped 2,9-dimethyl-4,7-diphenyl-1,10-phenanthroline, Li-doped tris(8-hydro-oxyquinoline)aluminum(III) ($Alq_3$), Mg-doped $Alq_3$, or Li-doped 1,3,5-tris(N-phenylbenimidazol-2-yl) benzene, and the p-type layer may be a metal oxide such as vanadium oxide ($V_2O_5$), tungsten oxide ($WO_3$), or molybdenum oxide ($MoO_3$).

If the charge generation layer 373 has uniform composition, the material of the charge generation layer 373 supplies both electrons and holes to the first and second organic light emitting members 371 and 372 respectively. In this case, the material of the charge generation layer 373 may be a mixture of n-type and p-type materials.

In FIG. 5C, the pixel electrode 191, the first organic light emitting member 371, and the charge generation layer 373 form a first organic light emitting diode LD_B1. The charge generation layer 373, the second organic light emitting member 372, and the common electrode 270 form a second organic light emitting diode LD_B2.

In this embodiment, the organic light emitting member of the blue pixel is formed by a different deposition sequence than the organic light emitting members of the red and green pixels. The blue pixel includes one more emission layers than the red and green pixels, and provides two organic light emitting diodes LD_B1 and LD_B2 coupled in series.

Each of the pixels R, G, and B of the OLED display has a long lifetime due to the light emitting materials forming the emission layers, and in some embodiments the blue light emitting material has a shorter lifetime than the red and green light emitting materials.

The lifetime of the emission layer or layers of each pixel relates to the current through the organic light emitting diode. The lifetime of the emission layer becomes generally shorter if more current flows through the organic light emitting diode. In some embodiments of the present invention, the number of emission layers and organic light emitting diodes of each blue pixel is increased to increase the blue pixels' lifetime, thus compensating for the shorter lifetime of the blue light emitting material. For example, as described above, the red and green pixels may each include a single organic light emitting diode, but the blue pixels may each include two organic light emitting diodes coupled in series to reduce the current flowing through the blue pixel's diodes, thereby improving the lifetime of the emission layers of the blue pixels. At the same time, the blue pixels' luminance is unchanged despite the smaller current through the blue light emitting diodes because the two diodes in each blue pixel provide double the luminance of a single diode.

Further, in some embodiments, there is no impact on the blue pixels' area or layout. In particular, in some embodiments, each blue pixel has the same area as each red pixel and each green pixel, so the organic materials can be deposited using a single shadow mask for the red, green and blue pixels. Also, in embodiments in which the blue pixels have the same areas as the red and green pixels, a relative reduction of the red and green pixels' areas is avoided to prevent the corresponding reduction in the lifetime of the display device.

Figure 6:
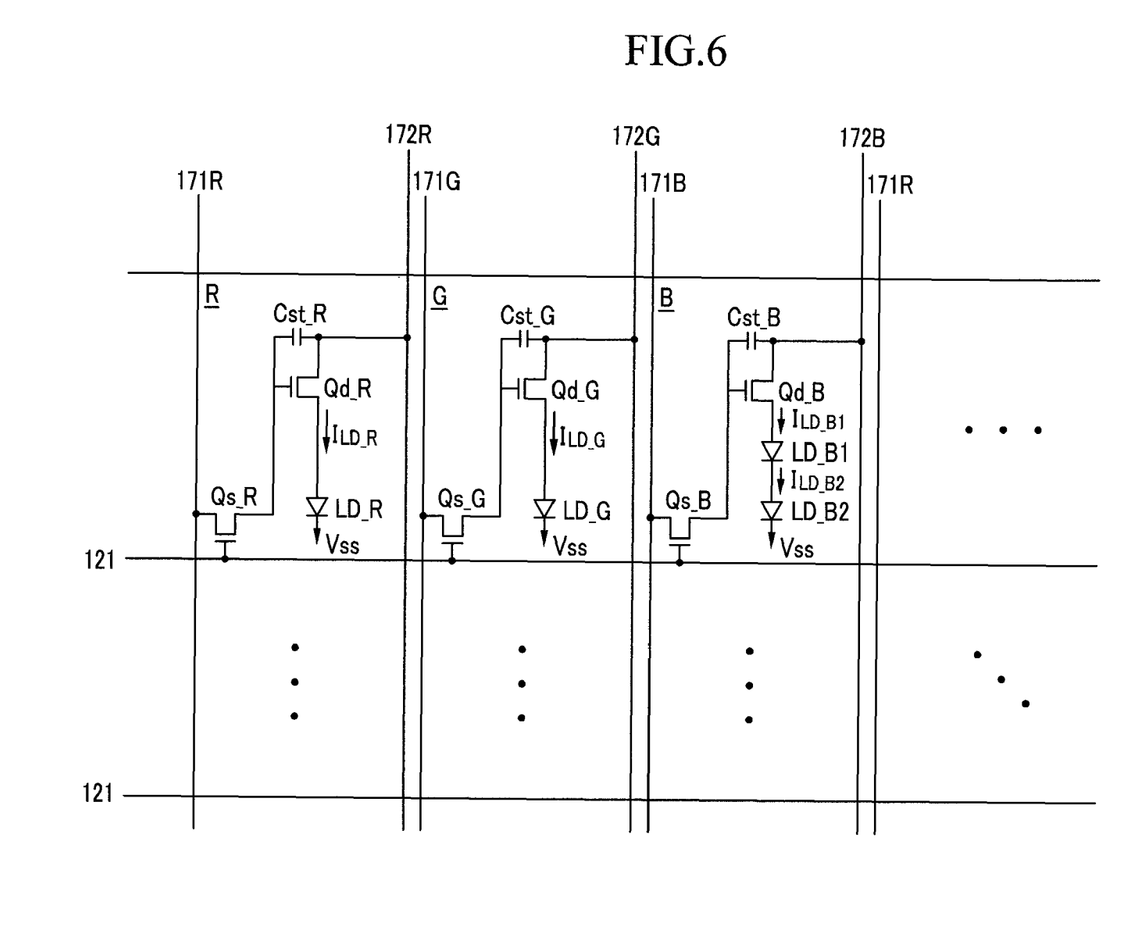
FIG. 6 is a circuit diagram of red, green, and blue pixels in an OLED display according to an exemplary embodiment of the present invention.

Operation of an OLED display according to an exemplary embodiment of the present invention will now be described with reference to FIG. 6 as well as FIGS. 1 to 5. FIG. 6 is a circuit diagram schematically showing a red pixel R, a green pixel G, and a blue pixel B of the OLED display. The red, green and blue pixels of FIG. 6 include respective switching transistors Qs_R, Qs_G, Qs_B, respective driving transistors Qd_R, Qd_G, and Qd_B, and respective storage capacitors Cst_R, Cst_G, and Cst_B. The red and green pixels include respective organic light emitting diodes LD_R and LD_G. The blue pixel includes organic light emitting diodes LD_B1 and LD_B2.

The switching transistors Qs_R, Qs_G, Qs_B each include a control terminal connected to a common gate line 121; an input terminal connected to the respective data line 171R, 171G, or 171B; and an output terminal connected to the respective driving transistor Qd_R, Qd_G, or Qd_B. The switching transistors Qs_R, Qs_G, Qs_B transmit data signals on the respective data lines 171R, 171G, 171B to the respective driving transistors Qd_R, Qd_G, Qd_B in response to the scanning signal on the gate line 121.

The driving transistors Qd_R, Qd_G, Qd_B each include a control terminal connected to the respective switching transistor Qs_R, Qs_G, or Qs_B; an input terminal connected to the respective driving voltage line 172R, 172G, or 172B; and an output terminal connected to the respective organic light emitting diode LD_R, LD_G, or LD_B1. In operation, the driving voltage lines 172R, 172G, 172B are at constant voltages. The data lines 171R, 171G, 171B provide data voltages defining desired luminances for the respective red, green and blue pixels connected to an active gate line. The driving transistors Qd_R, Qd_G, and Qd_B provide respective output currents $I_{LD\_R}$, $I_{LD\_G}$, and $I_{LD\_B}$ whose magnitudes depend on the voltage between the corresponding driving transistor's control and output terminals.

The switching transistors Qs_R, Qs_G, and Qs_B and the driving transistors Qd_R, Qd_G, and Qd_B are n-channel field effect transistors (FETs). In other embodiments, at least one of the switching transistors Qs_R, Qs_G, and Qs_B and the driving transistors Qd_R, Qd_G, and Qd_B may be a p-channel FET.

The capacitors Cst_R, Cst_G, and Cst_B are each connected between the control and input terminals of the respective driving transistor Qd_R, Qd_G, and Qd_B. The capacitors Cst_R, Cst_G, and Cst_B store data signals applied to the control terminals of the driving transistors Qd_R, Qd_G, and Qd_B and maintain the data signals after the switching transistors Qs_R, Qs_G, and Qs_B are turned off.

The organic light emitting diodes LD_R, LD_G, and LD_B1 have anodes connected to the output terminals of the respective driving transistors Qd_R, Qd_G, and Qd_B. The cathodes of the light emitting diodes LD_R, LD_G, LD_B2 are connected to a common voltage Vss. The cathode of the light emitting diode LD_B1 is connected to the anode of the light emitting diode LD_B2. The organic light emitting diodes LD_R, LD_G, and LD_B1 and LD_B2 emit light having intensity depending on the respective currents $I_{LD\_R}$, $I_{LD\_G}$, $I_{LD\_B1}$, and $I_{LD\_B2}$ to display an image.

The blue pixels B are operated in a different manner than the red and green pixels R and G. The luminance provided by an organic light emitting diode is defined by the diode's current. Since each blue pixel B has two organic light emitting diodes rather than one, some embodiments may require the current through a blue pixel B to be half the current through a red or green pixel to provide a given luminance level. As stated above, the desired luminance level for each pixel is defined by the data voltage on the respective data line 171R, 171G, or 171B. The desired luminance levels are defined by incoming data (e.g. digital data) which are used to generate the data voltages for the data lines 171R, 171G, 171B. In some embodiments, the same method (the same gamma conversion) is used for the red, green, and blue pixels to determine the data voltages from the incoming data. The reduced current is provided for the blue pixels B by providing a different voltage on the driving voltage lines 172B than on the driving voltage lines 172R, 172G.

More particularly, in each pixel, the voltage difference between the respective voltage driving line 172R, 172G, or 172B and the common voltage Vss is distributed according to the on-resistances of the pixel's driving transistor Qd_R, Qd_G, or Qd_b and the pixel's organic light emitting diode or diodes (i.e. diode LD_R for the red pixel, diode LD_G for the green pixel, diodes LD_B1 and LD_B2 for the blue pixel). In some embodiments, a blue pixel's two organic light emitting diodes have a higher on-resistance than each organic light emitting diode of the red and green pixels. Therefore, if the driving voltage lines 172R, 172G, 172B were at the same voltage, the blue pixel's current would be lower than the red or green pixel's current for a given data signal. However, in some embodiments, the blue pixel's current could undesirably fall below one half of the red or green pixel's current. Therefore, in order to increase the blue pixel's current to a value closer to the red or green pixel's current, the driving voltage lines 172B are kept at a higher voltage than the driving voltage lines 172R, 172G. The driving voltage lines 172R are kept at the same voltage as the driving voltage lines 172G.

In other embodiments, all the driving voltage lines 172R, 172G, 172B of the red, green, and blue pixels R, G, and B are at the same voltage, but the data signals on the data lines 171R, 171G, 171B are generated using a different method (different gamma conversion) for the blue pixels than for the red and green pixels. Consequently, for a given luminance level, the corresponding data signal applied to the control terminal of the driving transistor Qd_B of a blue pixel B has a larger voltage than for a red or green pixel.

Thus, in some embodiments, a blue pixel B displays the same luminance as a red or green pixel if the current through the blue pixel is one half of the current through the red or green pixel. If the driving voltage lines 172B of the blue pixels B were at the same voltage as the driving voltage lines 172R and 172G of the red and green pixels R and G, then for a given data signal, the voltage on the input terminal of the driving transistor Qd_B of a blue pixel B would be higher than for a red or green pixel due to the blue pixel B having twice as many organic light emitting diodes as each red or green pixel. Assuming that the control terminal of the driving transistor Qd_B is at the same voltage as for the driving transistors Qd_R and Qd_G, the current through the driving transistor Qd_B of the blue pixel B would be lower than for the red or green pixel, but the current through the blue pixel B could be too low, i.e. less than half the current through the red or green pixel. Therefore, the data signal applied to the control terminal of the driving transistor Qd_B is made to have a higher voltage than for the red or green pixel so as to raise the current of the driving transistor Qd_B to a level closer to one half of the current through the red or green pixel.

The invention is not limited to the embodiments in which the blue pixel B needs half the current through its light emitting diodes to display the same luminance as the red or green pixel. In other embodiments, the blue pixel B displays the same luminance at a current that is greater or less than one half of the current through the red or green pixel. For example, the blue pixel B may display the same luminance at a current equal to the current through each red or green pixel. In this case, the same data signal can be used for each pixel for a given luminance. The precise relationship between the currents through the red, green, and blue pixels may depend on the pixels' organic light emitting diodes.

[Exemplary Embodiment 2]

Figure 7:
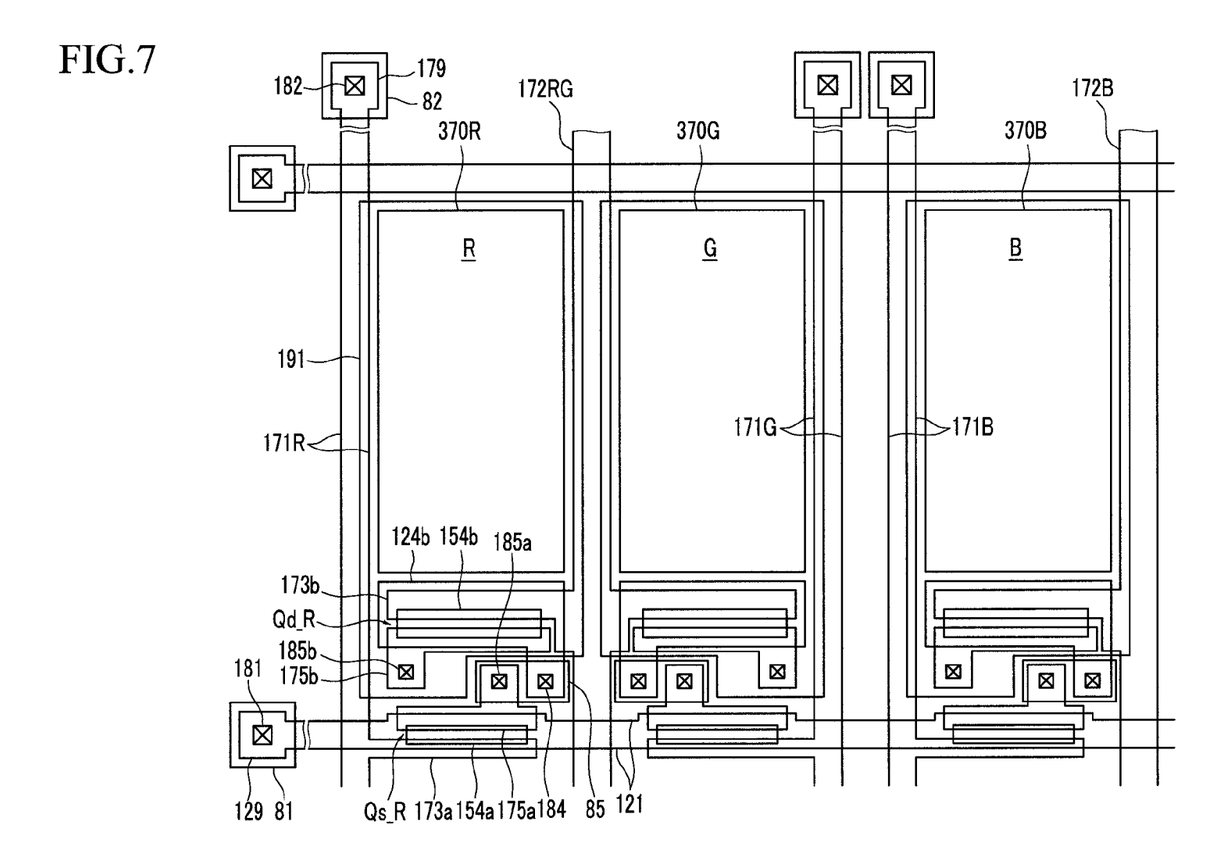
FIG. 7 is a layout view showing three neighboring pixels according to another exemplary embodiment of the present invention.
Figure 8:
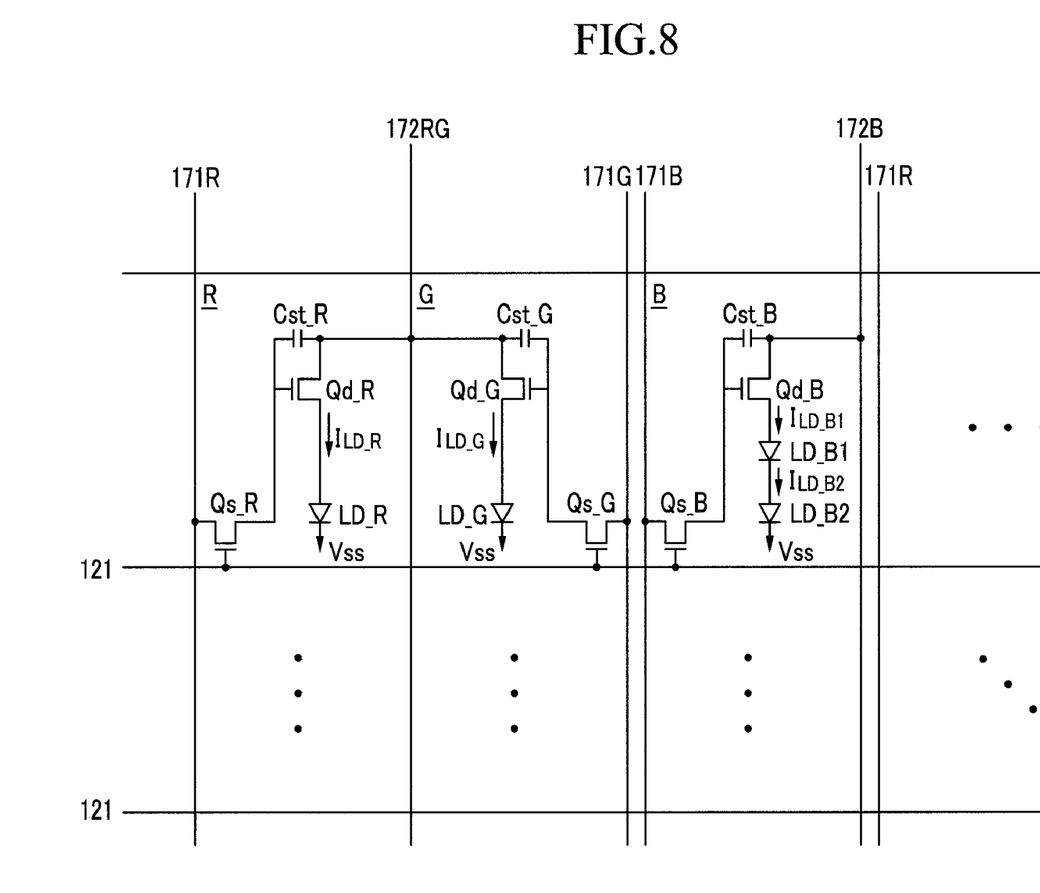
FIG. 8 is a circuit diagram of red, green, and blue pixels of an OLED display according to another exemplary embodiment of the present invention.

FIGS. 7 and 8 illustrate another exemplary embodiment of the present invention FIG. 7 is a layout view showing three neighboring pixels corresponding to a region marked by a dotted line in FIG. 1. FIG. 8 is a circuit diagram showing these red, green, and blue pixels of this embodiment.

In the present embodiment, the driving voltage lines 172R, 172G of the previous embodiment are merged into a common driving voltage line 172RG transmitting the driving voltages to the red pixel R and the green pixel G. The driving voltage line 172RG runs between the red pixel R and the green pixel G. The blue pixel B receives a driving voltage from a driving voltage line 172B. The driving voltage line 172RG is not necessarily at the same driving voltage as the driving voltage line 172B.

The red pixel R and the green pixel G may be symmetrical with respect to the driving voltage line 172RG. In the other respects, this embodiment is identical to the previous embodiment, and the same reference numerals designate the same elements.

Merging the driving voltage lines 172R, 172G into the common driving voltage line 172RG formed between the red pixel R and the green pixel G serves to increase the aperture ratio.

FIG. 8 illustrates a possible driving method for an OLED display according to the present embodiment. The red pixel R and the green pixel G are supplied with the common voltage from the common driving voltage line 172RG, and the driving voltage line 172B of the blue pixel B is supplied with a different voltage. In this example, because the blue pixel B has two light-emitting elements, the blue pixel B requires a larger driving voltage than the red and green pixels, each of which has only one organic light emitting element. Therefore, the driving voltage line 172B of the blue pixel B is provided with a larger voltage than the driving voltage line 172RG of the red and green pixels R and G. In the other respects, the driving method is the same as in the previous embodiment.

The invention is not limited to embodiments in which the blue light emitting material has a shorter lifetime than the red and green light emitting materials. The lifetime relationship can be reversed, and other lifetime relationships are possible, and still similar techniques can be used to optimize the OLED's overall lifetime.

The invention is not limited to the embodiments discussed above, but covers other embodiments and variations as defined by the appended claims.

What is claimed is:

1. An organic light emitting diode (OLED) display comprising:
an insulating layer having an opening; a first pixel configured for displaying a first colors; and
a second pixel configured for displaying a second color,
wherein the pixel comprises a first electrode, a second electrode overlapping the first electrode, and at least two light-emitting elements disposed between the first electrode and the second electrode,
wherein the at least two light-emitting elements are configured for emitting light of the first color, wherein entire areas of the at least two light-emitting elements are disposed inside the opening, and wherein first pixel has more light-emitting elements than the second pixel.

2. The OLED display of claim 1 further comprising a third pixel configured for displaying a third color, wherein the first pixel has more light-emitting elements than the third pixel.

3. The OLED display of claim 2, wherein each of the at least two light-emitting elements of the first pixel has a shorter expected lifetime than each of a light-emitting element of the second pixel and a light-emitting element of the third pixel.

4. The OLED display of claim 3, wherein the at least two light-emitting elements of the first pixel, the light-emitting element of the second pixel, and the light-emitting element of the third pixel are configured for emitting blue light, red light, and green light, respectively.

5. The OLED display of claim 3,
wherein the at least two light emitting elements of the first pixel comprise a first light-emitting element disposed between the first electrode and a charge generation layer and also comprise a second light-emitting element disposed between the charge generation layer and the second electrode, and
wherein the first pixel further comprises an auxiliary layer disposed between the first electrode and the first light-emitting element, between the first light-emitting element and the charge generation layer, between the charge generation layer and the second light-emitting element, between the second light-emitting element and the second electrode.

6. The OLED display of claim 5, wherein a light emitting member of the first pixel that comprises the at least two light-emitting elements is thicker than a light emitting member of the second pixel that comprises the light-emitting elements of the second pixel.

7. The OLED display of claim 6, wherein a thickness of the light emitting member of the second pixel is substantially equal to a thickness of a light emitting member of the third pixel, the light emitting members of the third pixel comprising the light-emitting elements of the third pixel.

8. The OLED display of claim 3,
wherein the first pixel, the second pixel, and the third pixel respectively include a first driving transistor, a second driving transistor, and a third driving transistor,
wherein the first driving transistor is connected to the first electrode,
and wherein the OLED display further comprises circuitry for providing a first driving voltage to the first driving transistor and for providing a second driving voltage different from the first driving voltage to each of the second driving transistor and the third driving transistor.

9. The OLED display of claim 8 wherein the circuitry comprises: a first driving voltage line connected to the first driving transistor for transmitting the first driving voltage; and a second driving voltage line connected to the second driving transistor and the third driving transistor for transmitting the second driving voltage.

10. A method for operating the OLED display of claim 8, the method comprising providing the first driving voltage to the first driving transistor of the first pixel and providing the second driving voltage to the second driving transistor of the second pixel and the third driving transistor of the third pixel.

11. The OLED display of claim 3,
wherein the first pixel, the second pixel, and the third pixel respectively include a first driving transistor, a second driving transistor, and a third transistor,
wherein the first driving transistor is connected to the first electrode, and
wherein the OLED display further comprises circuitry for generating and supplying data signals in response to luminance levels,
wherein the data signals include a first data signal supplied to the first driving transistor, a second data signal supplied to the second driving transistor, and a third data signal supplied to the third driving transistor, and
wherein for any luminance level, the first data signal has a larger voltage than each of the second data signal and the third data signal.

12. A method for operating the OLED display of claim 11, the method comprising providing different data signals to the first pixel and at least one of the second pixel and the third pixel for a given luminance level.

13. The OLED display of claim 1, wherein the first pixel further comprises: a charge generation layer disposed between the at least two light-emitting elements and disposed inside the opening.

14. The OLED display of claim 1, wherein an area of the first pixel is substantially equal to an area of the second pixel.

15. An organic light emitting diode (OLED) display comprising:
an insulating layer;
a first pixel comprising at least two first-color light-emitting element; and
a second pixel comprising a second-color light-emitting element,
wherein an entire area of the second-color light-emitting element is separated from each of the at least two first-color light-emitting elements by the insulating layer,
wherein each of the at least two first-color light-emitting elements has a shorter expected lifetime than the second-color light-emitting element.

16. The OLED display of claim 15 further comprising a third pixel, the third pixel comprising a third-color light-emitting element, wherein each of the at least two first-color light-emitting elements has a shorter lifetime than the third-color light-emitting element.

17. The OLED display of claim 15, wherein the insulator has a first opening, and wherein the first pixel further comprises a charge generation layer disposed between the at least two first-color light-emitting elements and disposed inside the first opening.

18. The OLED display of claim 15,
wherein the insulating layer further has a first opening, and wherein the at least two first-color light-emitting elements are disposed inside the first opening.

19. The OLED display of claim 18,
wherein the insulating layer further has a second opening, and
wherein the second-color light-emitting element is disposed inside the second opening.

20. The OLED display of claim 15, further comprising a circuitry for providing a first driving voltage to a first driving transistor of the first pixel and for providing a second driving voltage different from the first driving voltage to each of a second driving transistor of the second pixel and a third driving transistor of the third pixel.

21. The OLED display of claim 20, wherein the circuitry comprises: a first driving voltage line connected to the first driving transistor of the first pixel for transmitting the first driving voltage; and a second driving voltage line connected to the second driving transistor of the second pixel and the third driving transistor of the third pixel for transmitting the second driving voltage.

22. The OLED display of claim 20, wherein for any luminance level, the first driving voltage is larger than the second driving voltage.

23. An OLED display comprising:
a first pixel comprising a first driving transistor and at least two first-color light-emitting diodes connected to the first driving transistor;
a second pixel comprising a second driving transistor and a second-color light-emitting diode connected to the second driving transistor;
an insulating layer having a first opening and a second opening, the first opening containing entire areas of the at least two first-color light-emitting elements, the second opening containing an entire area of the second-color light-emitting elements; and
a circuitry for supplying a first driving voltage to the first driving transistor and for supplying a second driving voltage different from the first driving voltage to the second driving transistor.

24. The OLED display of claim 23 further comprising: a third pixel comprising a third driving transistor and a third-color light-emitting diode connected to the third driving transistor; wherein each of the at least two first-color light-emitting diodes has a shorter expected lifetime than the third-color light-emitting diode, and wherein the circuitry is further configured for supplying the second driving voltage to the third driving transistor.

25. The OLED display of claim 24, wherein said circuitry comprises: a first driving voltage line connected to the first driving transistor for transmitting the first driving voltage, and a second driving voltage line connected to the second driving transistor and the third driving transistor for transmitting the second driving voltage.

26. The OLED display of claim 24,
wherein the first pixel further comprises: a first light-emitting element and a second light-emitting element for emitting light of a same color, a first electrode disposed under the first light-emitting element, a second electrode disposed over the second light-emitting element, and a charge generation layer disposed between the first light-emitting element and the second light-emitting element,
wherein the first electrode, the first light-emitting element, and the charge generation layer form one of the two first-color light emitting diodes, and the charge generation layer, the second light-emitting element, and the second electrode form the other one of the two first-color light emitting diodes.

27. An OLED display comprising:
an insulating layer having an opening;
a first pixel configured for displaying a first color; and
a second pixels configured for displaying a second color,
wherein the first pixel comprises a first driving transistor and two light-emitting elements connected to the first driving transistor, entire areas of the two light-emitting elements being disposed inside the opening;
wherein at least one of the two light-emitting elements of the first pixel has a shorter expected lifetime than a light-emitting element of the second pixel.

28. The OLED display of claim 27 further comprising:
a third pixel configured for displaying a third color; and
a circuitry for generating and supplying a first data signal to the first pixel and a second data signal to the second pixel,
wherein for a given luminance level, the first data signal has a larger voltage than the second data signal.

29. The OLED display of claim 27,
wherein the two light-emitting elements comprise a first light-emitting element and a second light-emitting element for emitting light of a same color,
wherein the first pixel further comprises a charge generation layer disposed between the first and second light-emitting elements, and
wherein the charge generation layer contacts the insulating layer.

* * * * *